United States Patent
Lin et al.

(10) Patent No.: US 7,705,344 B2
(45) Date of Patent: Apr. 27, 2010

(54) LIGHT-EMITTING DEVICE

(75) Inventors: Ting-Yang Lin, Hsinchu (TW); Shih-Kuo Lai, Hsinchu (TW); Chen Ou, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 12/078,899

(22) Filed: Apr. 8, 2008

(65) Prior Publication Data

US 2008/0246018 A1 Oct. 9, 2008

(30) Foreign Application Priority Data

Apr. 9, 2007 (TW) .............................. 96112473 A

(51) Int. Cl.
*H01L 33/00* (2010.01)
(52) U.S. Cl. .............................. 257/13; 257/79; 257/98; 257/99; 257/103
(58) Field of Classification Search .................. 257/233, 257/292, 431–466, 13, 79–103, 918, E51, 257/E33, E25.028, E25.032; 438/48, 54, 438/65, 69, 70, 22–47, 493, 503, 507, 956
See application file for complete search history.

(56) References Cited

U.S. PATENT DOCUMENTS

| 6,706,542 | B1* | 3/2004 | Geva et al. ..................... 438/7 |
| 2004/0090779 | A1 | 5/2004 | Ou et al. |
| 2005/0156153 | A1* | 7/2005 | Futagawa ..................... 257/14 |
| 2005/0161683 | A1 | 7/2005 | Hahm et al. |
| 2007/0152207 | A1* | 7/2007 | Yen et al. ..................... 257/14 |
| 2009/0045393 | A1* | 2/2009 | Nakahara ..................... 257/13 |

FOREIGN PATENT DOCUMENTS

| CN | 1667850 | 9/2005 |
| CN | 1741290 | 3/2006 |

* cited by examiner

*Primary Examiner*—Wai-Sing Louie
*Assistant Examiner*—Sue Tang
(74) *Attorney, Agent, or Firm*—Bacon & Thomas, PLLC

(57) ABSTRACT

A light-emitting device includes a substrate, an n-type semiconductor layer, an active layer, and a p-type semiconductor layer; wherein the active layer is a multi-quantum-well (MQW) active layer with a predetermined n-type doping profile. More specifically, the MQW active layer is doped with n-type dopants in the region near the p-type semiconductor layer and the n-type semiconductor layer, and the central region is not doped with the n-type dopants.

21 Claims, 3 Drawing Sheets

LIGHT-EMITTING DEVICE

TECHNICAL FIELD

This invention relates to a light-emitting device, and more particularly to a light-emitting diode with a multi-quantum-well active layer.

REFERENCE TO RELATED APPLICATION

This application claims the right of priority based on TW application Ser. No. 096112473, filed "Apr. 9, 2007", entitled "Light-emitting Device" and the contents of which are incorporated herein by reference.

BACKGROUND

A light-emitting diode (LED) is an important type of solid-state devices that convert electric current to light. It comprises an active layer of semiconductor material located between two oppositely doped layers, one being p-type and the other being n-type. A drive voltage is applied across electrical contacts on the doped layers causing electrons and holes to be injected from the doped layers into the active layer. The electrons and holes then recombine to generate light that emits omni-directionally from the active layer and escapes from all the surfaces of the LED. Generally, the active layer is a single-quantum-well (SQW) layer or multi-quantum-well (MQW) layer. The MQW active layer is expected to achieve an improved device characteristic such as higher output as compared to an SQW active layer because the MQW active layer can emit light efficiently at a small current due to a plurality of mini-band structure.

FIG. 1 shows a conventional LED device having an MQW active layer with good efficiency and output. As shown in FIG. 1, the light-emitting device 10 comprises an MQW active layer 15 between a p-type nitride semiconductor layer 14 and an n-type nitride semiconductor layer 13. All the barrier layers, except the barrier layer next to the p-type nitride semiconductor layer 14, of the MQW active layer 15 are doped with n-type dopants. Moreover, there is another conventional LED device 20 as shown in FIG. 2. The light-emitting device 20 comprises an MQW active layer 25 between a p-type nitride semiconductor layer 24 and an n-type nitride semiconductor layer 23. Only several barrier layers near the n-type nitride semiconductor layer 23 of the MQW active layer 25 are doped with n-type dopants.

SUMMARY

In accordance with the first preferred embodiment of present invention, a light-emitting device comprises an n-type semiconductor layer, a p-type semiconductor layer, and an active layer between the n-type and p-type semiconductor layers. The active layer comprises a first region near the n-type semiconductor layer, a second region near the p-type semiconductor layer, and a third region between the first and second regions, wherein the first and second regions are doped with n-type dopants and the third region is undoped or doped with n-type dopants such that the concentration thereof in the third region is lower than not only the concentration of the n-type dopants in the first region but also that in the second region. In accordance with the second preferred embodiment of present invention, the structure of the active layer is the same as that in accordance with the first preferred embodiment except that the layer next to the p-type semiconductor layer in the second region is not doped with n-type dopants.

In accordance with the third preferred embodiment of the present invention, only the barrier layers in the first and second regions are doped with n-type dopants. In accordance with the fourth preferred embodiment, the structure of the active layer is the same as that in accordance with the third embodiment except that only one barrier layer next to the p-type semiconductor layer of the second region is undoped.

The advantage of the present invention lies in that the light-emitting efficiency of the light-emitting device can be achieved by means of the above-mentioned doping profiles.

DETAILED DESCRIPTION OF A PREFERRED EMBODIMENTS

Figure 1:
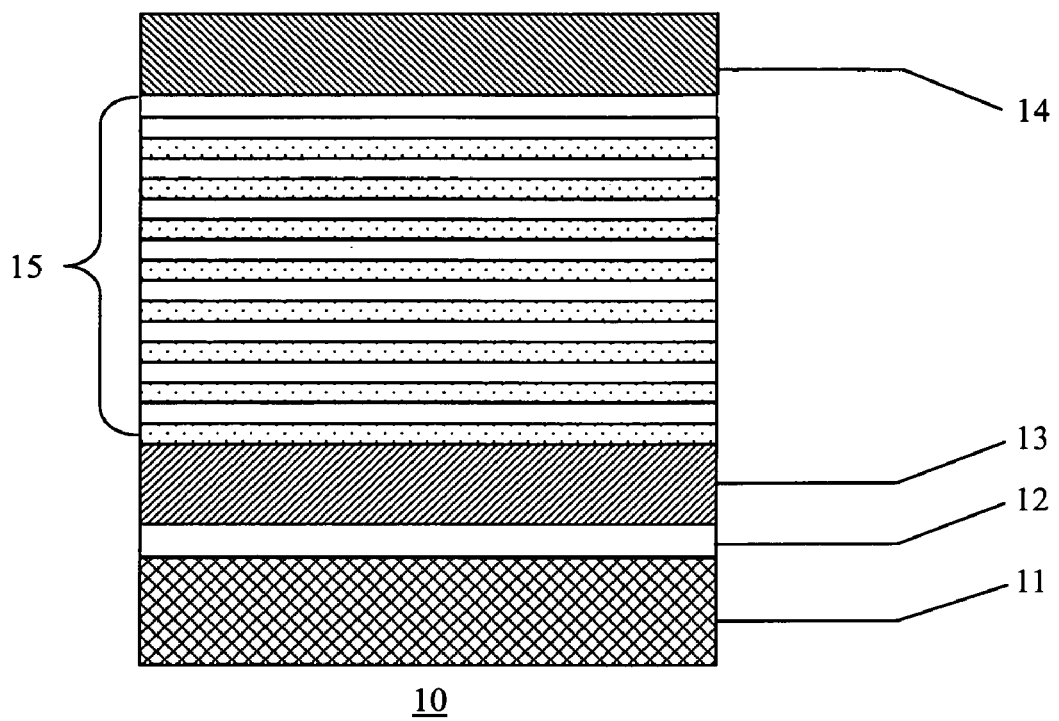
FIG. 1 shows a cross-sectional view of a conventional light-emitting device 10.
Figure 2:
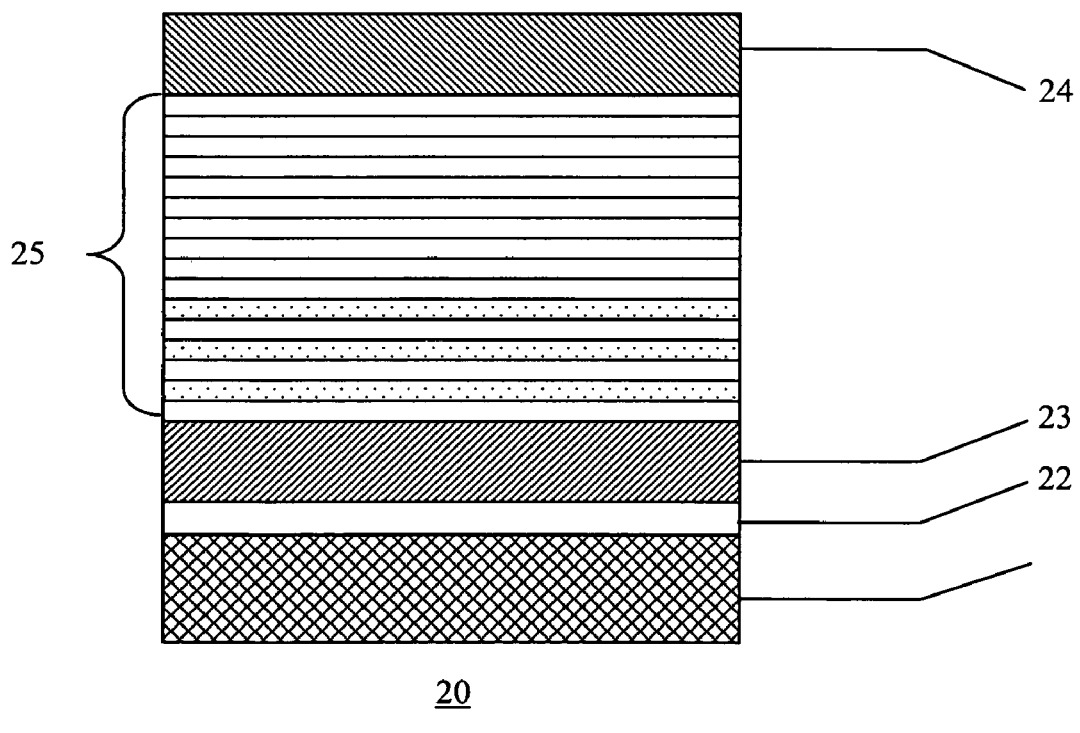
FIG. 2 shows a cross-sectional view of another conventional light-emitting device 20.
Figure 3:
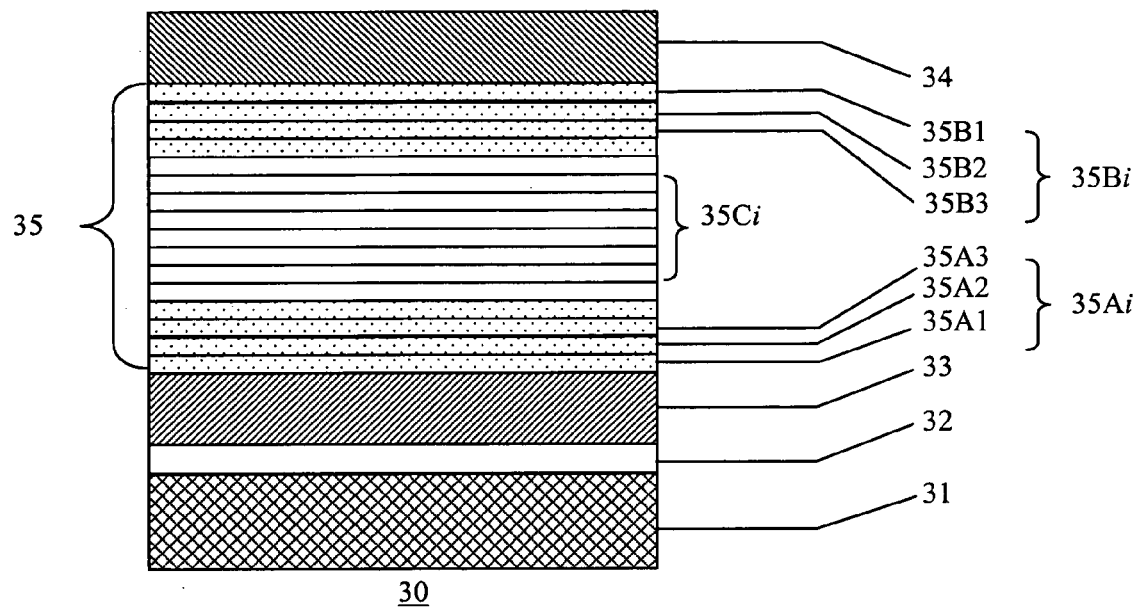
FIG. 3 shows a cross-sectional view of the light-emitting device 30 in accordance with a first embodiment of the present invention.

Referring to the FIG. 3, a light-emitting device 30 in accordance with the first embodiment of the present invention comprises a substrate 31, a buffer layer 32, an n-type nitride semiconductor layer 33, an active layer 35, and a p-type nitride semiconductor layer 34. The active layer 35 is a multi-quantum well structure formed by laminating a plurality of alternate barrier layers and well layers. Moreover, the active layer 35 is divided into three regions including a first region 35Ai (i=1,2,3, . . . ) near the n-type nitride semiconductor layer 33, a second region 35Bi (i=1,2,3, . . . ) near the p-type nitride semiconductor layer 34, and a third region 35Ci (i=1, 2,3, . . . ) between the first region 35Ai and the second region 35Bi. Furthermore, a layer 35A1, a layer 35A2, a layer 35A3, and so on form a stack in the first region 35Ai, wherein the layer 35A1 is next to the n-type nitride semiconductor layer 33; a layer 35B1, a layer 35AB2, a layer 35B3, and so on form a stack in the second region 35Bi, wherein the layer 35B1 is next to the p-type nitride semiconductor layer 33. Besides, the layer 35A1, the layer 35A3, the layer 35B1 and the layer 35B3 are barrier layer; the layer 35A2 and the layer 35B2 are well layers. In other words, the layers indicated by final odd numbers are barrier layers and the layers indicated by final even numbers are well layers. In accordance with the first embodiment, the first region 35Ai and the second region 35Bi (such as the layer 35A1, the layer 35A2, the layer 35A3, the layer 35B1, the layer 35B2, the layer 35B3) are doped with n-type dopants and the layers in the third region 35Ci are undoped or doped with the n-type dopants having a concentration lower than that in the first region 35Ai and that in the second region 35Bi.

Figure 4:
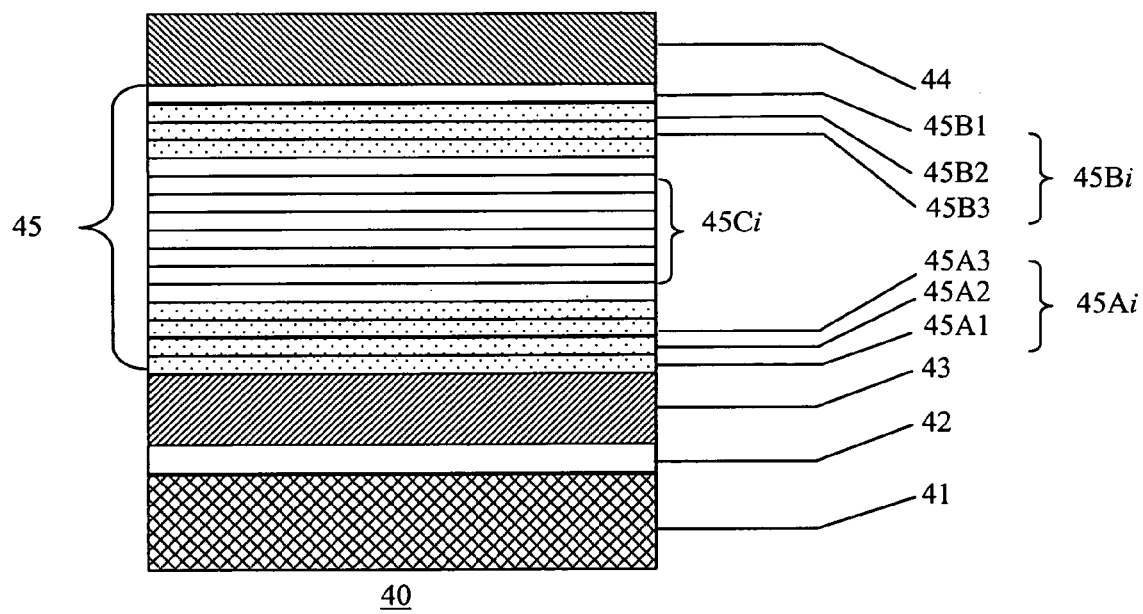
FIG. 4 shows a cross-sectional view of the light-emitting device 40 in accordance with a second embodiment of the present invention.

Referring to FIG. 4 a light-emitting device 40 in accordance with a second embodiment of the present invention comprises a substrate 41, a buffer layer 42, an n-type nitride semiconductor layer 43, an active layer 45, and a p-type nitride semiconductor layer 44. The active layer 45 is a multi-quantum well structure formed by laminating a plurality of alternate barrier layers and well layers. Moreover, the active layer 45 is divided into three regions including a first region 45Ai (i=1,2,3, . . . ) near the n-type nitride semiconductor layer 43, a second region 45Bi (i=1,2,3, . . . ) near the p-type nitride semiconductor layer 44, and a third region 45Ci (i=1, 2,3, . . . ) between the first region 45Ai and the second region 45Bi. Furthermore, a layer 45A1, a layer 45A2, a layer 45A3, and so on form a stack in the first region 45Ai, wherein the layer 45A1 is next to the n-type nitride semiconductor layer 43; a layer 45B1, a layer 45B2, a layer 45B3, and so on form the second region 45Bi, wherein the layer 45B1 is next to the p-type nitride semiconductor layer 44. Besides, the layer 45A1, the layer 45A3, the layer 45B1 and the layer 45B3 are barrier layer; the layer 45A2 and the layer 45B2 are well layers. In the other words, the layers indicated by final odd numbers are barrier layers and the layers indicated by final even numbers are well layers. In accordance with the second embodiment, the first region 45Ai and the second region 45Bi (such as the layer 45A1, the layer 45A2, the layer 45A3, the layer 45AB2, the layer 45B3) are doped with n-type dopants except that the layer 45B1 and the layers in the third region 45Ci are undoped or doped with the n-type dopants having a concentration lower than that in the first region 45Ai and that in the second region 45Bi.

Figure 5:
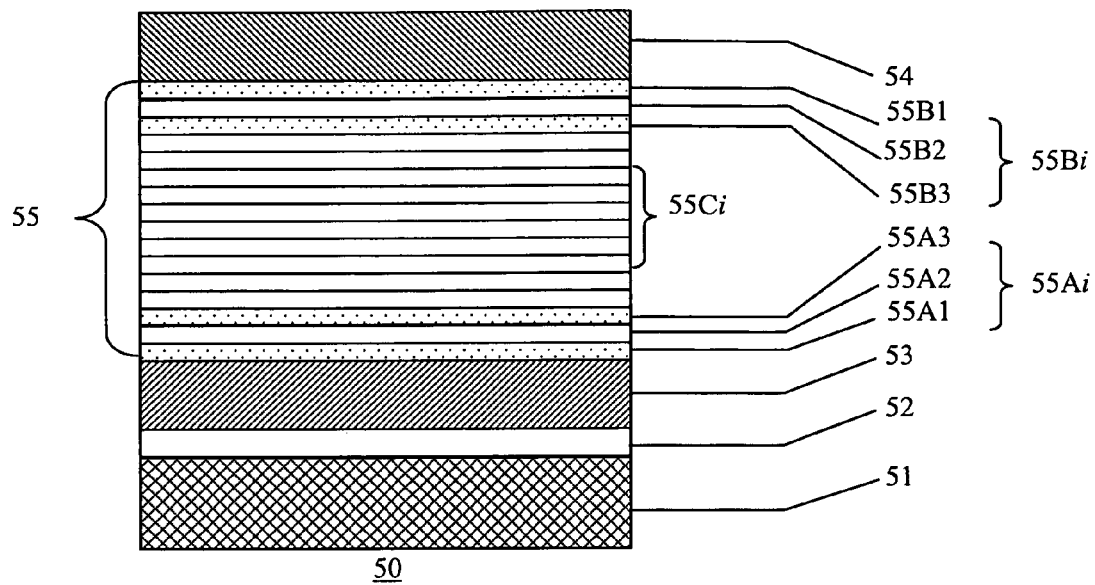
FIG. 5 shows a cross-sectional view of the light-emitting device 50 in accordance with a third embodiment of present invention.

Referring to FIG. 5, light-emitting device 50 in accordance with a third embodiment of the present invention comprises a substrate 51, a buffer layer 52, an n-type nitride semiconductor layer 53, an active layer 55, and a p-type nitride semiconductor layer 54. The active layer 55 is a multi-quantum well structure formed by laminating a plurality of alternate barrier layers and well layers. Moreover, the active layer 55 is divided into three regions including a first region 55Ai (i=1, 2,3, . . . ) near the n-type nitride semiconductor layer 53, a second region 55Bi (i=1,2,3, . . . ) near the p-type nitride semiconductor layer 54, and a third region 55Ci (i=1,2, 3, . . . ) between the first region 55Ai and the second region 55Bi. Furthermore, a layer 55A1, a layer 55A2, a layer 55A3, and so on form a stack in the first region 55Ai, wherein the layer 55A1 is next to the n-type nitride semiconductor layer 53; a layer 55B1, a layer 55AB2, a layer 55B3, and so on form a stack in the second region 55Bi, wherein the layer 55B1 is next to the p-type nitride semiconductor layer 53. Besides, the layer 55A1, the layer 55A3, the layer 55B1 and the layer 55B3 are barrier layers; the layer 55A2 and the layer 55B2 are well layers. In the other words, the layers indicated by final odd numbers are barrier layers and the layers indicated by final even numbers are well layers. In accordance with the third embodiment, the barrier layers of the first region 55Ai and the second region 55Bi (such as the layer 55A1, the layer 55A3, the layer 55AB1, the layer 55B3) are doped with n-type dopants and the third region 55Ci is undoped or doped with the n-type dopants having a concentration lower than that in the first region 55Ai and that in the second region 55Bi.

Figure 6:
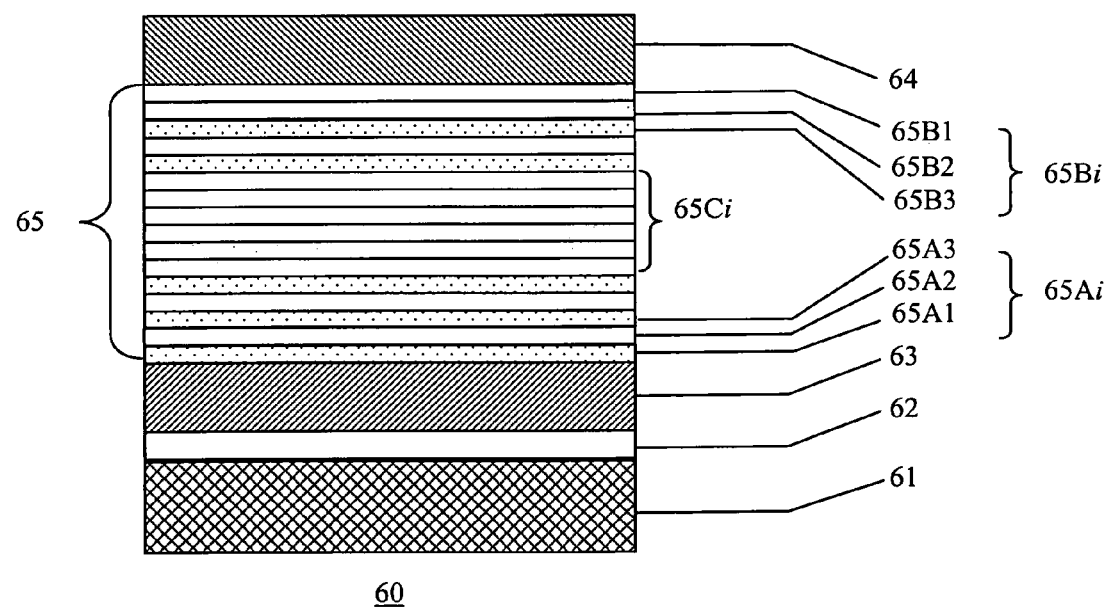
FIG. 6 shows a cross-sectional view of the light-emitting device 60 in accordance with a fourth embodiment of the present invention.

Referring to FIG. 6, a light-emitting device 60 in accordance with a fourth embodiment of the present invention comprises a substrate 61, a buffer layer 62, an n-type nitride semiconductor layer 63, an active layer 65, and a p-type nitride semiconductor layer 64. The active layer 65 is a multi-quantum well structure formed by laminating a plurality of alternate barrier layers and well layers. Moreover, the active layer 65 is divided into three regions including a first region 65Ai (i=1,2,3, . . . ) near the n-type nitride semiconductor layer 63, a second region 65Bi (i=1,2,3, . . . ) near the p-type nitride semiconductor layer 64, and a third region 65Ci (i=1, 2,3, . . . ) between the first region 65Ai and the second region 65Bi. Furthermore, a layer 65A1, a layer 65A2, a layer 65A3, and so on form a stack in the first region 65Ai, wherein layer 65A1 is next to the n-type nitride semiconductor layer 63; a layer 65B1, a layer 65B2, a layer 65B3, and so on form a stack in the second region 65Bi, wherein the layer 65B1 is next to the p-type nitride semiconductor layer 63. Besides, the layer 65A1, the layer 65A3, the layer 65B1 and the layer 65B3 are barrier layers; the layer 65A2 and the layer 65B2 are well layers. In the other words, the layers indicated by odd numbers are barrier layers and the layers indicated by even numbers are well layers. In accordance with the fourth embodiment, the barrier layers of the first region 65Ai and the second region 65Bi (such as the layer 65A1, the layer 65A3, the layer 65B3) are doped with n-type dopants except that the layer 65B1 and the third region 65Ci are undoped or doped with the n-type dopants having a concentration lower than the that in the first region 65Ai and that in the second region 65Bi.

As the above description, the n-type dopants are selected from the group consisting of silicon (Si), germanium (Ge), tin (Sn), sulfur(S), and oxygen (O) and the concentration of the n-type dopants in the doped layer is between $5 \times 10^{16} \sim 1 \times 10^{19}/cm^3$. The concentration of the n-type dopants in the undoped layers is below $1 \times 10^{17}/cm^3$ due to diffusion or contamination in the manufacturing process. The different doped layers have substantially same concentration or higher concentration in the regions nearer the p-type or n-type nitride semiconductor layers.

The foregoing description has been directed to specific embodiments of this invention. It is apparent that other variations and modifications may be made to the embodiments, with the attainment of some or all of their advantages. Therefore, it is the object of the appended claims to cover all such variations and modifications that fall within the spirit and scope of the invention.

What is claimed is:

1. A light-emitting device comprising:
   an n-type semiconductor layer;
   a p-type semiconductor layer; and
   an active layer between the n-type and p-type semiconductor layers, comprising a first region near the n-type semiconductor layer, a second region near the p-type semiconductor layer, and a third region between the first and second regions,
   wherein each of the first region, the second region, and the third region at least comprises a barrier layer and a well layer, the first and second regions are doped with n-type dopants and the third region is undoped or doped with the n-type dopants having a concentration lower than that in the first region and that in the second region.

2. A light-emitting device according to claim 1, wherein the active layer is a multi-quantum well structure.

3. A light-emitting device according to claim 1, wherein the n-type semiconductor layer, the p-type semiconductor layer, and the active layer comprise nitride.

4. A light-emitting device according to claim 1, wherein the n-type dopants are selected from the group consisting of silicon (Si), germanium (Ge), tin (Sn), sulfur (S), and oxygen (O).

5. A light-emitting device according to claim 1, wherein the concentration of the n-type dopants in the first and second regions is between $5 \times 10^{16} \sim 1 \times 10^{19}/cm^3$.

6. A light-emitting device according to claim 1, wherein the second region includes a plurality of layers, and the layer next to the p-type semiconductor layer is undoped.

7. A light-emitting device according to claim 6, wherein the n-type semiconductor layer is an n-type nitride semiconductor layer and the p-type semiconductor layer is a p-type nitride semiconductor layer.

8. A light-emitting device according to claim 6, wherein the n-type dopants are selected from the group consisting of silicon (Si), germanium (Ge), tin (Sn), sulfur (S), and oxygen (O).

9. A light-emitting device according to claim 6, wherein the concentration of n-type dopants in the first and second regions is between $5 \times 10^{16} \sim 1 \times 10^{19}/cm^3$.

10. A light-emitting device according to claim 1, wherein the concentration of the n-type dopants in the first region and that in the second region are substantially the same.

11. A light-emitting device according to claim 1, wherein the n-type dopants in the first region and the second region have higher concentration in the barrier layer and/or the well layer near the p-type or n-type semiconductor layer.

12. A light-emitting device comprising:
an n-type semiconductor layer;
a p-type semiconductor layer; and
an active layer formed by a plurality of barrier layers and well layers, between the n-type and p-type semiconductor layers, including a first region near the n-type semiconductor layer, a second region near the p-type semiconductor layer, and a third region between the first and second regions,
wherein each of the first region, the second region, and the third region at least comprises a barrier layer and a well layer,
wherein each barrier layer of the first and second regions is doped with n-type dopants and the barrier layer of the third region is doped with the n-type dopants with a concentration lower than that in the barrier layers of the first region and the second region.

13. A light-emitting device according to claim 12, wherein the n-type semiconductor layer is an n-type nitride semiconductor layer and the p-type semiconductor layer is a p-type nitride semiconductor layer.

14. A light-emitting device according to claim 12, wherein the n-type dopants are selected from the group consisting of silicon (Si), germanium (Ge), tin (Sn), sulfur (S), and oxygen (O).

15. A light-emitting device according to claim 12, wherein the concentration of n-type dopants in the first and second regions is between $5 \times 10^{16} \sim 1 \times 10^{19}/cm^3$.

16. A light-emitting device according to claim 12, wherein the concentration of the n-type dopants in the barrier layers of the first region and that in the second region are substantially the same.

17. A light-emitting device according to claim 12, wherein the n-type dopants in the barrier layers of the first region and the second region have higher concentration in the barrier layer and/or the well layer near the p-type or n-type semiconductor layers.

18. A light-emitting device comprising:
an n-type semiconductor layer;
a p-type semiconductor layer; and
an active layer comprising a first region near the n-type semiconductor layer, a second region near the p-type semiconductor layer, and a third region between the first and second regions,
wherein each of the first region, the second region, and the third region at least comprises a barrier layer and a well layer, the barrier layer next to the p-type semiconductor layer of the second region is undoped, and the other barrier layers of the first and second regions are doped with n-type dopants and each barrier layer of the third region is doped with the n-type dopants with a concentration lower than that in the barrier layers of the first region and the second region.

19. A light-emitting device according to claim 18, wherein the n-type semiconductor layer is an n-type nitride semiconductor layer and the p-type semiconductor layer is a p-type nitride semiconductor layer.

20. A light-emitting device according to claim 18, wherein the n-type dopants are selected from the group consisting of silicon (Si), germanium (Ge), tin (Sn), sulfur (S), and oxygen (O).

21. A light-emitting device according to claim 18, wherein the concentration of the n-type dopants in the barrier layers of the first and second regions is between $5 \times 10^{16} \sim 1 \times 10^{19}/cm^3$.

* * * * *